United States Patent
Jackson et al.

(10) Patent No.: US 6,679,946 B1
(45) Date of Patent: Jan. 20, 2004

(54) METHOD AND APPARATUS FOR CONTROLLING SUBSTRATE TEMPERATURE AND LAYER THICKNESS DURING FILM FORMATION

(75) Inventors: Andrew William Jackson, Boulder, CO (US); Mark J. Dalberth, Lafayette, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 0 days.

(21) Appl. No.: 09/967,212

(22) Filed: Sep. 27, 2001

Related U.S. Application Data
(60) Provisional application No. 60/236,019, filed on Sep. 27, 2000.

(51) Int. Cl.[7] ............................................... C30B 25/08
(52) U.S. Cl. ............................ 117/84; 117/84; 117/85; 117/86
(58) Field of Search ................................. 117/84, 85, 86

(56) References Cited

U.S. PATENT DOCUMENTS

| | | | |
|---|---|---|---|
| 5,118,200 A | 6/1992 | Kirillov et al. | 374/120 |
| 5,388,909 A | 2/1995 | Johnson et al. | 374/161 |
| 6,116,779 A | 9/2000 | Johnson et al. | 374/161 |

OTHER PUBLICATIONS

Springthorpe, et al.; In Situ Growth Rate Measurements During Molecular Beam Epitaxy Using an Optical Pyrometer; Appl. Phys. Lett., vol. 55 (20); Nov. 1989; pp. 2138–2140.

Boebel, et al.; In Situ Film Thickness and Temperature Control of Molecular Beam Epitaxy Growth by Pyrometric Interferometry; Journal of Crystal Growth 150; 1995; pp. 54–61.

Houng, et al., In Situ Thickness Monitoring and Control for Highly Reproducible Growth of Distributed Bragg Reflectors; J. Vac. Sci. Technol. vol. 12, No. 2; Mar./Apr.; 1994; pp. 1221–1224.

Chalmers, et al.; Method for Accurate Growth of Vertical–Cavity Surface–Emitting Lasers; Appl. Phys. Lett., vol. 62, No. 11; Mar. 1993; pp. 1182–1184.

Breiland, et al.; A Virtual Interface Method for Extracting Growth Rates and High Temperature Optical Constants from Thin Semiconductor Films Using In Situ Normal Incidence Reflectance; J. Appl. Phys. vol. 78, No. 11; Dec. 1995; pp. 6726–6736.

Li, et al.; Simultaneous In Situ Measurement of Substrate Temperature and Layer Thickness Using Diffuse Reflectance Spectroscopy (DRS) During Molecular Beam Epitaxy; Journal of Crystal Growth, 175/176; 1997; pp. 250–255.

*Primary Examiner*—Felisa Hiteshew
(74) *Attorney, Agent, or Firm*—Barlow, Josephs & Holmes, Ltd.

(57) ABSTRACT

A method and apparatus for determining substrate temperature and the mirror center of a film structure formed on the substrate utilizes a transmission intensity spectrum of light to determine mirror center and a normalized transmission intensity spectrum of light to determine substrate temperature. White light is transmitted through the substrate and the film structure during the film structure formation process. Also during the film formation process, a reflected light intensity spectrum is obtained using the same or another light source, for light reflected by the film structure. Substrate temperature and mirror center may be determined during formation of the film structure and, based on the measured temperature and mirror center, the mirror center may be adjusted by changing film formation conditions during the film formation process to vary the thickness of the films being formed. The method and apparatus find particular application in the in-situ monitoring and adjustment of distributed Bragg reflectors used as semiconductor mirrors.

31 Claims, 8 Drawing Sheets

METHOD AND APPARATUS FOR CONTROLLING SUBSTRATE TEMPERATURE AND LAYER THICKNESS DURING FILM FORMATION

RELATED APPLICATION

This application claims priority of U.S. Provisional Application Ser. No. 60/236,019, entitled "Method and Apparatus for Controlling Substrate Temperature and Layer Thickness During Epitaxial Growth of VCSELS", filed Sep. 27, 2000, the contents of which are herein incorporated by reference.

FIELD OF THE INVENTION

The present invention relates generally to vertical cavity surface emitting lasers (VCSELs) and methods for forming the same. More particularly, the present invention relates to a method and apparatus for the in-situ control of epitaxial layer thickness and deposition temperature during the formation of long wavelength VCSELs.

BACKGROUND OF THE INVENTION

VCSELs are highly favored as optical sources in today's optoelectronics industry. An array of VCSELs is simultaneously formed on a substrate such as gallium arsenide (GaAs), by epitaxially forming a multiplicity of films over the GaAs substrate. The formed VCSEL includes a lower mirror or distributed Bragg reflector (DBR), an active region, and an upper mirror or DBR. The active region is formed between the upper and lower DBRs and supplies the photons which provide the light source. The active region may consist of one or more quantum wells, quantum dots, quantum wires, or other electrically or optically pumped gain media. The mirrors disposed above and below the active region cause the light to be reflected within the optical cavity of the VCSEL, which, in turn, stimulates additional photon generation from the active region. It is important to control the operational characteristics of a VCSEL, for example, the electrical current to optical power ratio, the current threshold for lasing, and the wavelength of the light which is internally reflected and emitted.

The composition, film characteristics and film thicknesses of the layers that combine to form the DBRs, determine the wavelength of reflected light. As such, it is important to control these characteristics to produce a mirror or DBR having a desired mirror center wavelength for reflecting light and a desired range of wavelengths which reflect light. Long wavelength VCSELs, for example, are currently being targeted to have a mirror center at about 1300 nanometers (nm) in order to reflect and emit light having a wavelength on the order of 1300 nm. Each of the individual layers that combine to form the mirrors should desirably be formed to a thickness equal to a quarter wavelength of the light that is desired to be reflected, divided by the index of refraction of the material, in order to insure that light of the desired wavelength is emitted. It is thus important to control the thickness of the individual layers. The thicknesses of the individual layers depend directly upon deposition time. It is therefore important to control deposition time.

The individual layers that combine to form the mirrors are epitaxially formed at elevated temperatures, and the film quality of the individual films and therefore the reflectance of the mirror, are dependent upon the temperature of formation. Moreover, at elevated temperatures, the measured DBR qualities such as mirror center are different than at room temperature. A measured mirror center versus temperature correlation is available to determine whether the desired mirror center at room temperature has been achieved for a particular structure. As such, the substrate temperature at which the mirror center measurement is made, should be accurately determined in order to assess whether or not the desired mirror center has been achieved, whether or not a film thickness adjustment must be made, and, if so, to what extent. As such, it is also important and desirable to monitor substrate temperature during formation.

Qualities such as film thickness, film quality, film formation rate, film formation temperature and reflectance of the DBR should desirably be monitored as the DBR is being formed. It is particularly desirable to continuously monitor these qualities at a stage early enough in the deposition process such that a real-time adjustment can be made during the film formation process to produce a final mirror structure having the desired DBR center wavelength and optical range. Existing techniques for layer thickness control of DBRs used in VCSELs include emissivity corrected pyrometric interferometry, reflection spectroscopy, and single wavelength reflection oscillations. Each of these techniques involves the in-situ measurement of a reflection off the substrate surface during the epitaxial formation of the semiconductor film layers. There are at least two shortcomings associated with each of these approaches. First, the optical system should preferably be designed to accommodate the unpredictable and variable deflection of the reflected light caused by substrate wobble during rotation. In the case of reflection corrected pyrometric interferometry and single wavelength reflectance oscillations, a further complication is the necessity of measuring absolute reflectivity. Absolute reflectivity measurements are especially difficult in the presence of substrate wobble. The second shortcoming associated with each of these methods is that the optical viewports used to monitor reflectance become clouded during the epitaxial deposition process and cause errors in the absolute reflectivity measurements by attenuating both the transmitted and reflected optical signals.

It is therefore desirable to provide an apparatus and method for providing in-situ measurement of the reflectivity of the DBR mirrors and substrate temperature, preferably as the layers which make up the DBR mirror are being formed. It is further desirable to provide such a method that preferably avoids and is not susceptible to the shortcomings described above. Moreover, it is desirable to provide such an apparatus and method for obtaining these measurements at a preliminary stage of the process sequence used to form the DBR, so that film formation parameters can be adjusted during the formation process and the DBR being produced, will have desired reflectance qualities.

SUMMARY OF THE INVENTION

To meet these and other needs, the present invention provides a method and apparatus for controlling the characteristics of a series of films as they are being formed on a substrate. In one embodiment, the present invention provides an apparatus and method for utilizing the transmission of light through the substrate on which the films are being formed. The light is transmitted through the substrate to provide real-time information on the mirror center of the films as they are being formed. A raw transmission intensity spectrum provides this information. The present invention also provides an apparatus and method for using light reflected from the substrate to normalize the transmission intensity spectrum. The normalized transmission intensity spectrum is preferably used to determine substrate temperature.

In another embodiment, the present invention further provides for analyzing the transmission intensity spectrum data, evaluating the measured mirror center and substrate temperature and preferably providing feedback to the film formation system on a real-time basis in order to adjust system settings and to ensure that the formed series of films has the desired thickness and mirror center and reflects light at the desired wavelength.

BRIEF DESCRIPTION OF THE DRAWINGS

The present invention is best understood by the following detailed description when read in conjunction with the accompanying drawings. It is emphasized that, according to common practice, various features of the drawings are not to-scale. On the contrary, the dimensions of the various features are arbitrarily expanded or reduced for clarity. Included in the drawings are the following figures.

Appendix A provides an exemplary algorithm for calculating mirror center; and

Appendix B provides an exemplary algorithm for calculating substrate temperature.

Like numerals denote like features throughout the specification and figures.

DETAILED DESCRIPTION OF THE INVENTION

The present invention provides both a method and apparatus for performing in-situ monitoring and control of a series of films formed, or being formed, on a substrate. The present invention utilizes light transmitted through, and reflected off of, the substrate, to determine the substrate temperature and mirror center of the series of films as they are being formed. If the mirror center is not as desired at the measured substrate temperature, the present invention provides for adjusting film formation parameters such as formation time and/or formation rate to change the thickness of the films so as to adjust the mirror center of the stack of formed films. This monitoring and adjustment preferably may be made real-time during the process in which the series of films are being formed. The present invention finds particular application in the fabrication of vertical cavity surface emitting lasers (VCSELs), in particular, the fabrication of the semiconductor mirror portion, or DBR of a VCSEL. According to another exemplary embodiment, the present invention may be used in conjunction with a DBR used in a resonant photodetector. It should be understood, however, that the present invention is not limited to monitoring and adjusting film formation characteristics for a DBR or a for a VCSEL. Rather, the present invention can be used to monitor and adjust the film formation characteristics for any stack of films formed on a substrate. For simplicity, however, the present invention will be described with respect to the exemplary formation of a distributed Bragg reflector of a VCSEL.

Figure 1:
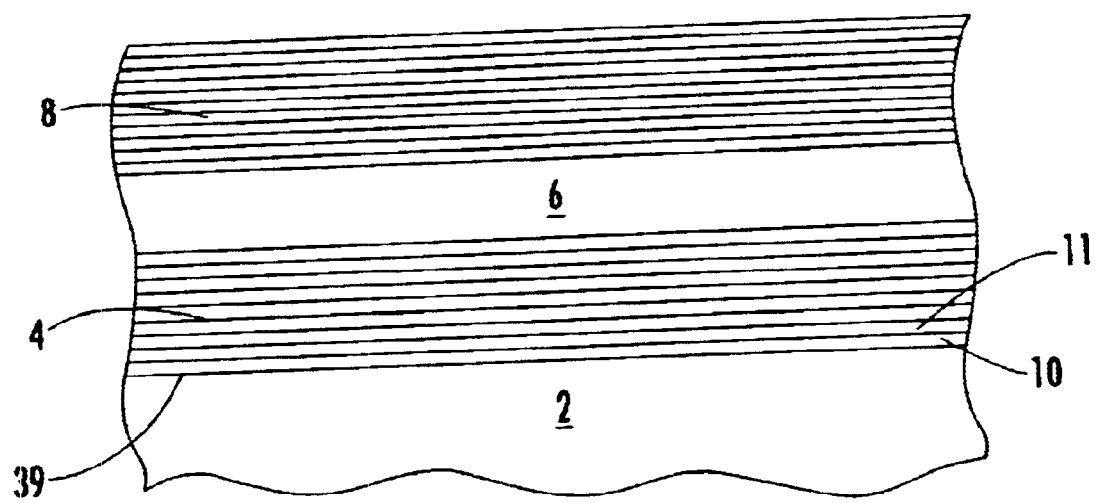
FIG. 1 is a cross-sectional view showing a VCSEL structure formed over a substrate.

FIG. 1 is a cross-section view showing a VCSEL device formed on a substrate. Substrate 2 is formed of gallium arsenide (GaAs) in an exemplary embodiment but suitable substrates that transmit white light in the 1100–1700 nm range may be used alternatively. According to other exemplary embodiments, substrate 2 may be formed of InP, silicon, SiC, sapphire or other materials. The VCSEL structure formed on substrate 2 preferably includes lower DBR 4, upper DBR 8 and quantum well layer 6 formed between the upper and lower DBRs. It should be understood that quantum well layer 6 will typically be formed of multiple layers. For purposes of simplicity and clarity, quantum well layer 6 is shown as a single layer. It should be further understood that the embodiment shown in FIG. 1 is exemplary and does not show other films and features which may typically be included in VCSELs. According to an exemplary embodiment, the VCSEL is a long-wavelength VCSEL emitting at approximately 1300 nm and therefore designed to include DBRs which preferably reflect light at a mirror center wavelength of approximately 1300 nm. According to another exemplary embodiment, the VCSEL may be any VCSEL including long wavelength VCSELs that emit at 1550 or 1650 nm.

In an exemplary embodiment, lower DBR 4 is substantially similar to upper DBR 8 and is formed directly on front surface 39 of substrate 2 and prior to the formation of quantum well layer 6 and upper DBR layer 8. Each of the DBR layers is preferably produced by forming a series of two alternating films such as films 10 and 11 of lower DBR 4, a plurality of times. According to an exemplary embodiment, each of the films is epitaxially formed in a formation chamber of a molecular beam epitaxy (MBE) system using conventional molecular beam epitaxial formation techniques. Other film formation techniques may be used alternatively. The films are desirably formed to a thickness equal to one quarter wavelength ($\lambda/4$) of the light to be reflected, divided by the index of refraction of the material. An adjacent set of films therefore preferably includes a total thickness of $\lambda/2$ (adjusted by the respective refractive indices of the films). According to an exemplary embodiment, the thickness of each of the layers may be approximately 1000 angstroms but other thicknesses may be used alternatively depending on the film used, the desired mirror center wavelength of reflected light, and the material used to form the films. According to one exemplary embodiment, each of films 10 and 11 may include a thickness within the range of 20 to 200 nm. Various other film thicknesses may be used according to other exemplary embodiments in which other VCSELs or other optoelectronic devices are being formed. The adjacent, alternating layers are preferably chosen for maximum variation of their respective refractive indices. According to an exemplary embodiment, the alternating layers may include a GaAs layer and an aluminum arsenide (AlAs) layer. According to other exemplary embodiments, the adjacent films which form the repeating pairs of layers, may be formed of other materials. Materials commonly used in various combination to form the alternating films include nitrogen (N), aluminum (Al), gallium (Ga), indium (In), arsenic (As), phosphorous (P) and antimony (Sb). According to an exemplary embodiment, each DBR layer may include 26 periods of layer pairs, or 52 individual layers. It should be understood that the present invention provides a method for in-situ monitoring of the reflectance of DBRs as they are being formed and is not limited to performing this function on any particular film structure. As such, various other combinations of alternating high index/low index films may be used to form the DBRs and each DBR mirror may consist of any of various numbers of individual layers.

Figure 2:
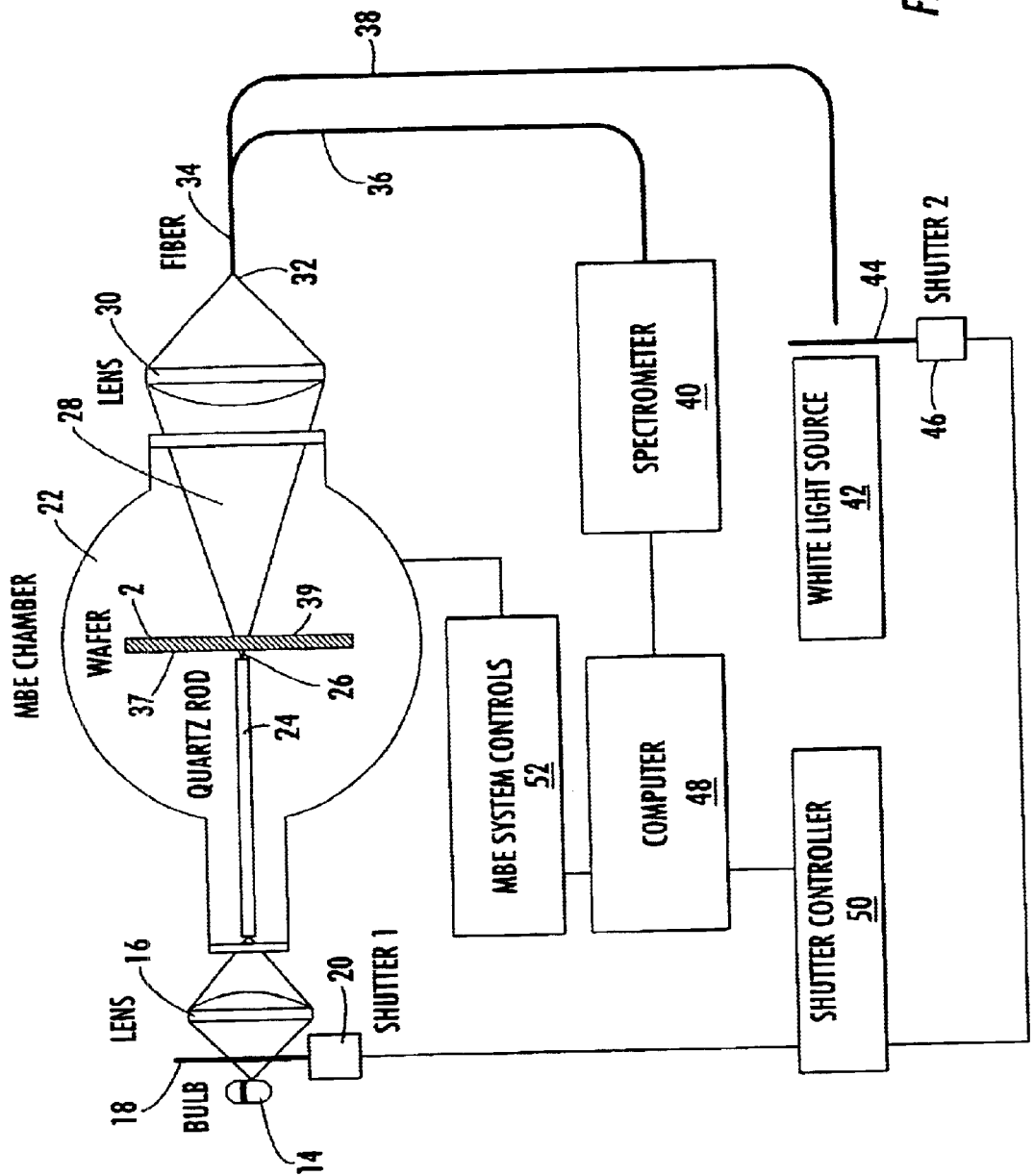
FIG. 2 is a schematic diagram showing the arrangement of various elements of the apparatus of the present invention.

FIG. 2 shows a schematic diagram of an exemplary apparatus of the present invention. Exemplary gallium arsenide substrate 2, alternatively referred to as a wafer, is positioned within MBE chamber 22 of an MBE tool within which the epitaxial film growth (also referred to as deposition) process occurs. A conventional bulb 14 and lens 16 are used as an optical source to provide white light along a quartz rod. According to other exemplary embodiments, other light sources chosen to be transmissive through the substrate may be used. In one embodiment, quartz rod 24 directs a beam of the white light onto a particular location 26 on back surface 37 of substrate 2. Other means such as a series of lenses, may be used to direct light to one of the surfaces of substrate 2, according to other exemplary embodiments. A portion of the white light is transmitted through substrate 2 as the lower DBR is being formed, according to one exemplary embodiment, to provide in-situ monitoring. According to another exemplary embodiment, monitoring may be done incrementally after some of the films are formed and the film formation process has been halted. The optical source, such as bulb 14, may be positioned opposite or facing front surface 39 of substrate 2 on which the films are formed, with the detecting means disposed facing the opposite surface. The transmitted portion of light 28 is preferably focused by lens 30 onto optical fiber 34, which directs the light along secondary optical fiber 36 to spectrometer 40, such as an infrared spectrometer, for detection and analysis. Spectrometer 40 preferably detects and measures the amount of transmitted light at various wavelengths of interest and provides a transmission intensity spectrum.

According to an exemplary embodiment, spectrometer 40 feeds information to computer 48, which preferably employs one or more algorithms to analyze the transmission intensity spectrum to determine mirror center and substrate temperature during the formation process in which the series of individual alternating films are sequentially formed. Other analytical tools and methods may be used alternatively. Once mirror center wavelength and substrate temperature have been determined, the values of the tool or system settings may be adjusted to control the parameters of film formation, in order to form the film stack to have the desired mirror characteristics at the formation temperature. This may be done in-situ and continuously, during the sequential formation of the series of films. According to another exemplary embodiment, this monitoring and adjusting may be done intermittently.

The range of wavelengths of light that the film structure reflects, is typically directly related to the thicknesses of the alternating layers which combine to form the DBR. Film thickness is typically directly related to film formation time and formation rate. The mirror center of a series of alternating films having different refractive indices generally varies with the thickness and time of formation of each of the films, such as films 10 and 11 shown in FIG. 1. As such, by varying film formation time or rate to vary thickness, the DBR may be modified, during formation, to reflect light at the desired wavelength and the mirror center or other reflection characteristics, can thereby be adjusted as the DBR is being formed. As such, when the mirror center is determined to be higher than desired, various system parameters may be used to decrease the thickness of either or both of the films. When the measured mirror center is lower than desired, system parameters are preferably changed to increase the thickness. When the detected mirror center requires adjustment, either or both film thicknesses may be varied to desirably produce each adjacent set of films to have a total thickness of one-half wavelength of the light desired to be reflected, respectively adjusted by the refractive indexes of the films. The substrate temperature, also determined according to the present invention, influences the mirror center. The measured mirror center of a structure varies with the temperature of the substrate upon which the structure is formed due to the dependence of the index of refraction on temperature. After mirror center and substrate temperature measurements have both preferably been made, a decision regarding adjustment of the mirror center, may accurately be made. It is therefore desirable to determine substrate temperature when making mirror center measurements.

According to one exemplary embodiment, computer 48 is directly coupled to the MBE system controls 52 to provide feedback information to the MBE system, which is preferably configured to automatically adjust film properties such as thickness and therefore DBR qualities. The MBE tool may be adjusted by MBE systems controls 52 based on information provided by computer 48. Typical system parameters that may influence film thickness include pressure, temperature, first film formation time, first film formation rate, second film formation time and second film formation rate. Various analytical techniques and analytical tools may be used to analyze the transmission spectrum data and provide real-time feedback information to the MBE tool.

The exemplary light provided to the exemplary quartz rod 24 by the bulb 14/lens 16 arrangement is preferably white light. White light includes wavelengths ranging from 400 or 500 nm up to the infrared range at about 1700 nm. Other optical sources which provide light including wavelengths ranging from about 800 nm to about 1700 nm may be used alternatively. Optical sources providing light having wavelengths of various other ranges may be used alternatively, and will preferably be chosen in conjunction with a substrate which is transmissive to wavelengths of light within the wavelength range used. At room temperature, the gallium arsenide substrate is transmissive to light radiation having wavelengths of about 900 nm or greater. Shorter wavelength light is absorbed in the substrate. The absorption of light with a wavelength less than 900 nm defines the room temperature band edge of GaAs. As the temperature of the substrate is increased, such as during the epitaxial MBE film formation process, the lowest wavelength at which light is absorbed, is increased. Therefore, the band edge wavelength at which transmission begins is indicative of wafer temperature. Epitaxial deposition processes typically include a film formation temperature within the range of 550° C. to 750° C. and a band edge between 1000–1200 nm for GaAs. Other deposition temperatures may be used alternatively. Transmitted portion 28 of the light beam that is transmitted through substrate 2 is preferably focused by lens 30 onto optical fiber 34 and detected by spectrometer 40 using conventional methods. The present invention finds particular application in long wavelength VCSELs. Long wavelength VCSELs typically have a DBR center wavelength well above the minimum light wavelength which is transmitted through the substrate within the range of typical operating temperatures, for example, at 1300 nm.

Still referring to FIG. 2, the apparatus of the present invention also includes means for detecting light which is reflected off of substrate 2, in particular, the light is reflected by the series of films formed on substrate 2. According to one exemplary embodiment as shown in FIG. 2, white light source 42, through fiber 38 and lens 30, may direct light onto front surface 39 of substrate 2 when shutter 44 is open. The light which reflects off of the films formed on front surface 39 of substrate 2, preferably travels along optical fiber 34, secondary fiber 36 and is sensed by spectrometer 40. Spectrometer 40 is capable of developing a reflection intensity spectrum from the reflected light sensed and providing this information to an analytical tool or tools. In the exemplary embodiment shown in FIG. 2, spectrometer 40 is coupled to computer 48. In another exemplary embodiment, a further spectrometer (not shown) may be included and dedicated to sensing the reflected light. According to this exemplary embodiment, the further spectrometer may feed information such as a reflection intensity spectrum to computer 48 or other analytical tools. This reflection intensity spectrum may be normalized and the normalized reflection intensity spectrum used to normalize the transmission intensity spectrum, as will be shown in FIGS. 3–7.

A series of shutters, such as shutter 44 and shutter 18, are preferably coupled to shutter controller 50 and are opened or closed depending on which light-transmitted or reflected, is desired to be sensed by spectrometer 40. For example, if shutter 18 is closed and shutter 44 is open, spectrometer 40 will detect reflected light in which white light source 42 is the optical source. According to the exemplary embodiment in which shutter 18 is open and shutter 44 is closed, spectrometer 40 will sense light which originates from optical source 14 and is transmitted through substrate 2. If each of shutter 18 and shutter 44 are closed, spectrometer 40 will sense substantially only background light and neither of reflected light or transmitted light. Background light may be produced by a substrate heater, for example. Such can later be subtracted from the total detected light.

In an exemplary embodiment, a transmission bulb spectrum may additionally be recorded with shutter 18 open, shutter 44 closed, and substrate 2 removed from the system. This transmission bulb spectrum may be used to correct the "raw" transmission intensity spectrum that may additionally be corrected to subtract background light. In an exemplary embodiment, the "raw" transmission spectrum is produced by subtracting the background spectrum from the recorded transmission spectrum and then dividing by the previously stored transmission bulb spectrum. Various other conventional techniques may be used to correct for background light and light from the light source, to produce the raw transmission intensity spectrum which is subject to analysis as described below. In another exemplary embodiment, a reflection bulb spectrum may be additionally obtained with shutter 44 open, shutter 18 closed, and with substrate 2 preferably replaced by a gold reflector. This reflection bulb spectrum may be used to correct the "raw" reflection intensity spectrum. In an exemplary embodiment, the "raw" reflection spectrum is produced by subtracting the background spectrum from the detected reflection spectrum and then dividing by the previously stored reflection bulb spectrum. Various other conventional techniques may be used to correct for background light and light from the light source to produce the raw reflection intensity spectrum which is subject to analysis as described below.

Figure 3:
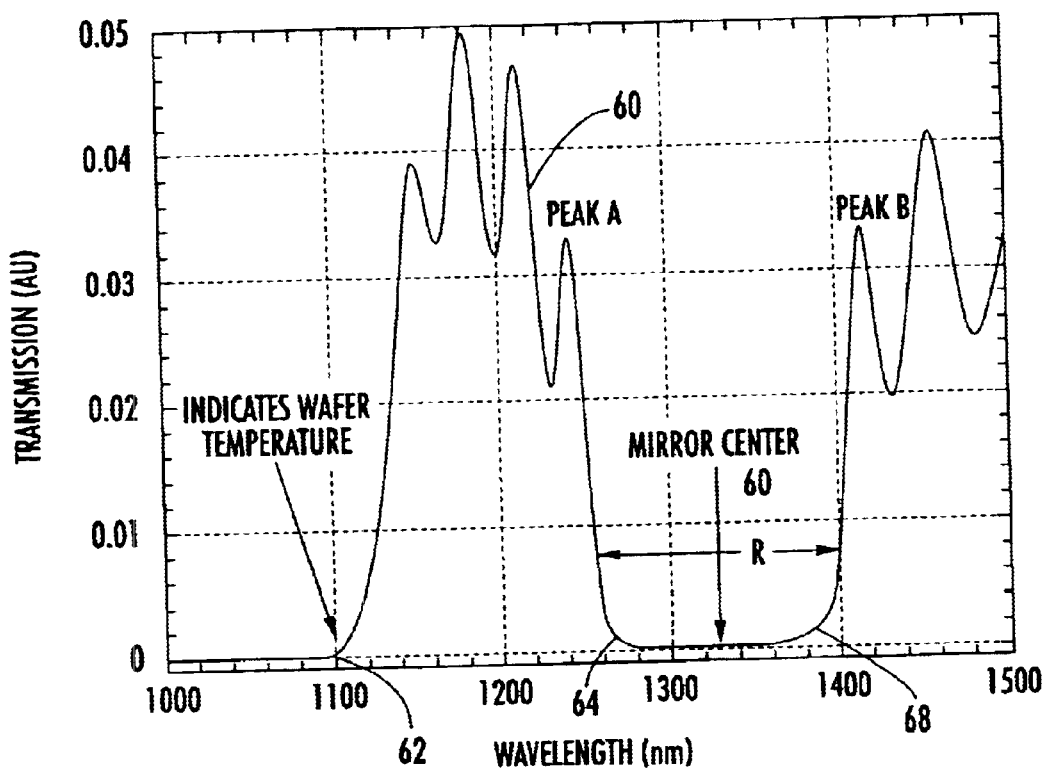
FIG. 3 is an exemplary raw transmission intensity spectrum.

FIG. 3 shows a plot of an exemplary raw transmission intensity spectrum. The transmission spectrum shown in FIG. 3 is taken at an instant in time during which the lower DBR stack is being formed and is provided by an infrared spectrometer. The transmission spectrum may include the corrections described above. According to an exemplary embodiment wherein 26 periods (52 layers) are used to form the lower DBR stack, the transmission spectrum may be taken after five periods or ten alternating layers have been formed on the substrate. If the transmission spectrum is recorded at this early stage, it can be analyzed and preferably fed back to the MBE system in time to adjust process parameters in order to produce both a lower and upper DBR each having a desired mirror center wavelength at the corresponding substrate temperature. According to embodiments in which different numbers of periods are used to form the DBR, the sampling may begin at another sufficiently early stage in the film formation process. After the initial sampling, the transmission spectrum may continue to be sampled, recorded and analyzed during the sequential formation of the subsequently formed films of the film stack. The transmission spectrum may be sampled and analyzed at any appropriate sampling frequency. According to one exemplary embodiment, it may be monitored continuously and processing parameters may be adjusted continuously, responsive to the continuous monitoring.

If the DBR center wavelength of lower DBR 4, as indicated by the transmission spectrum, appears to be in need of adjustment, the film formation time may be adjusted for the films which combine to form the DBRs. The DBR center wavelength is directly related to the thicknesses of the formed films, as above. If other anomalies are indicated by the transmission spectrum, other system settings may be adjusted accordingly. Once the adjustment is made, each of the layers which form the mirror, will be formed to have the desired characteristics such as film thickness. The same is applied to the layers of upper DBR 8 based on the spectrum sampled from lower DBR 4.

The intensity of light which is transmitted through the substrate and various epitaxial layers deposited on the substrate, is measured using an infrared spectrometer which produces a transmission intensity spectrum. From the measured transmission intensity spectrum, both the wafer temperature and the layer thicknesses of the DBR stack can be determined as follows. According to plot 60 shown in FIG. 3, light transmission is sensed for light having wavelengths greater than about 1100 nm. Point 62 indicates this band edge wavelength and is determinative of substrate temperature. Point 62 is also known as the knee wavelength. As wafer temperature is increased, the band edge at the wavelength where transmission begins, will also be increased. In this manner, band edge 62 is associated with a substrate temperature. Various algorithms and methods are available to convert band edge wavelength to substrate temperature. If the substrate temperature is not the desired temperature, the temperature can be adjusted accordingly, in response to the measured temperature. Furthermore, accurate substrate temperature measurement is critical since the measurement of mirror center 66 is a function of substrate temperature, as above. While substrate temperature may be obtained from the raw transmission intensity spectrum as shown in FIG. 3, such temperature data is advantageously obtained using a normalized transmission intensity spectrum, as will be shown in FIG. 7.

As shown in the exemplary embodiment in FIG. 3, the transmission spectrum oscillates above 1100 nm in the transmission range. Between Peak A and Peak B, transmission drops to zero as the light is reflected, not transmitted, within this range. This is the range of light reflected by the DBR stack formed on the substrate at the instant the transmission intensity spectrum is taken. Virtually no transmission is noted in the reflection region between points 64 and 68. The DBR structure appears to have a range R of about 140 nm. Mirror center 66 is shown to be about 1330 nm in the exemplary embodiment. Alternatively stated, the peak reflection or DBR center wavelength appears to be approximately 1330 nm. Mirror center, represented by point 66 in FIG. 3, is an approximation of the measured mirror center at the measured temperature. The mirror center may be accurately calculated using data such as Peak A and Peak B from the raw transmission intensity spectrum shown in FIG. 3, and using an algorithm such as the exemplary algorithm shown in Appendix A. A computer may be used to apply the algorithm to the data. Other algorithms and analytical methods for calculating the mirror center, based on the raw transmission intensity spectrum, may be used according to other exemplary embodiments.

The transmission spectrum is analyzed and if the measured DBR center wavelength or range is not the desired value for the corresponding temperature determination based on point 62, appropriate system adjustments will be made accordingly. For example in FIG. 3, if the desired DBR center wavelength is not 1330 nm at the measurement temperature, MBE system settings such as film formation time may be adjusted accordingly to adjust film thickness. If other analyses of the transmission spectrum suggest that other qualities of the DBR are not as desired, appropriate adjustments may be made to the temperature or other system settings.

Band edge 62 of the raw transmission intensity spectrum shown in FIG. 3, indicative of wafer temperature, may be influenced by the DBR oscillations which may distort the spectrum and may result in premature, delayed, or inaccurate detection of band edge wavelength 62. According to one exemplary embodiment, the present invention may utilize an exemplary algorithm, which detects, and adjusts for, the influence of the DBR oscillations in order to determine accurate band edge wavelength and therefore accurate wafer temperature. According to other exemplary embodiments, other analytical methods may be used.

Another embodiment of the present invention involves normalization associated with the transmission spectrum analysis. According to this exemplary embodiment, reflection measurements may continuously or intermittently be made, adjusted, and used to normalize the transmission intensity spectrum to compensate for any misleading oscillations and to accurately determine substrate temperature and mirror center.

Figure 4:
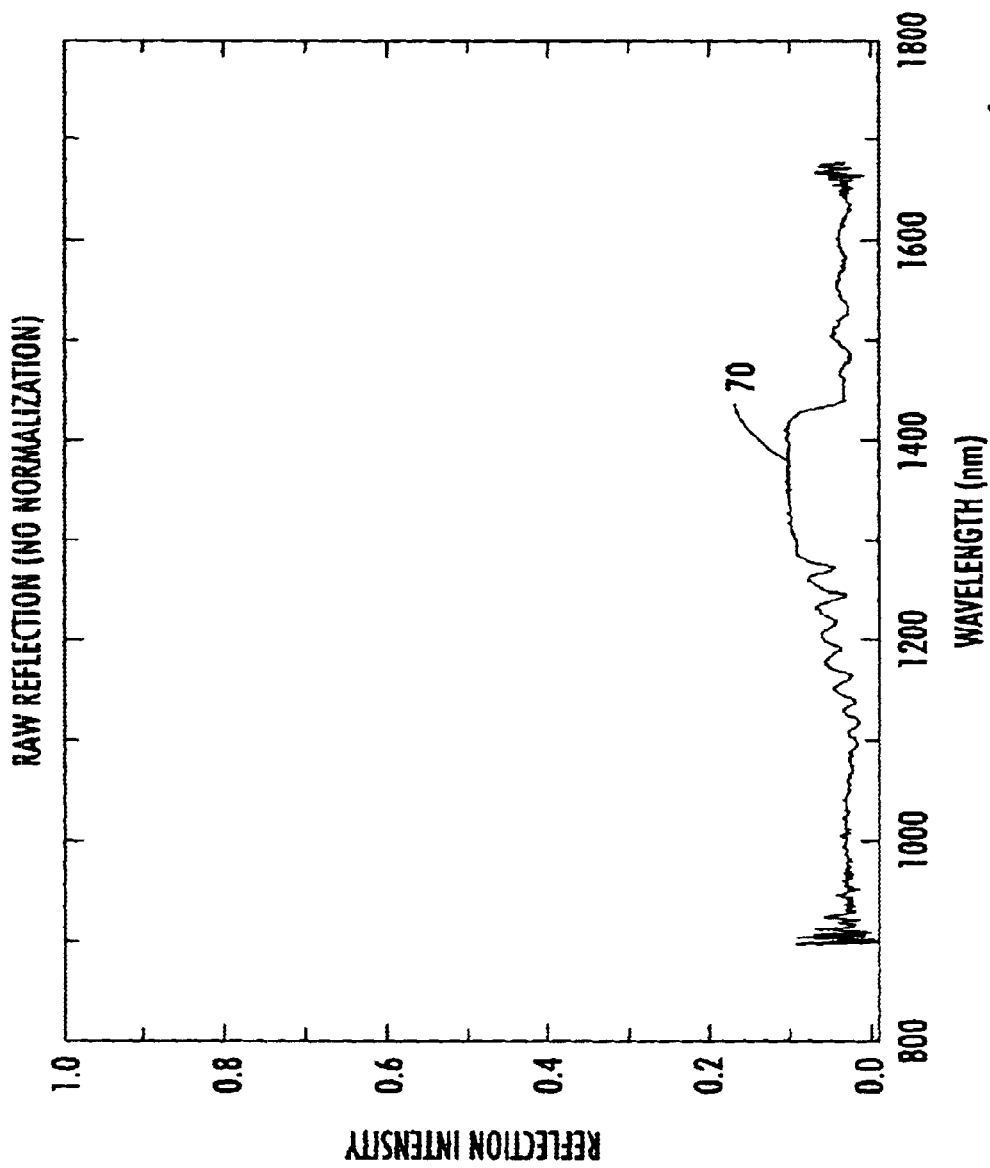
FIG. 4 is an exemplary raw reflection intensity spectrum.

In the transmission intensity spectrum shown in FIG. 3, for example, the oscillations in the transmission spectrum may be normalized to ensure the accuracy of band edge wavelength 62, which is indicative of substrate temperature. The oscillations may be caused by substrate wobble or other measurement effects. Normalization may be done by using a reflection intensity spectrum, such as may be obtained according to one of the exemplary arrangements described in conjunction with FIG. 2. When the apparatus shown in FIG. 2 is set up so that spectrometer 40 detects light reflected by the film stack, an exemplary reflected light intensity spectrum, such as shown in FIG. 4, is obtained. Shutter controller 50 may open and close shutters 18 and 44 such that alternating transmission and reflectivity data are obtained in rapid succession, each preferably continuously or at regular intervals suitable to provide adequate feedback information.

FIG. 4 includes plot 70 of the raw reflected light intensity at various wavelengths. This raw reflection intensity spectrum may be normalized to produce a normalized reflection intensity spectrum, such as shown in FIG. 5.

Figure 5:
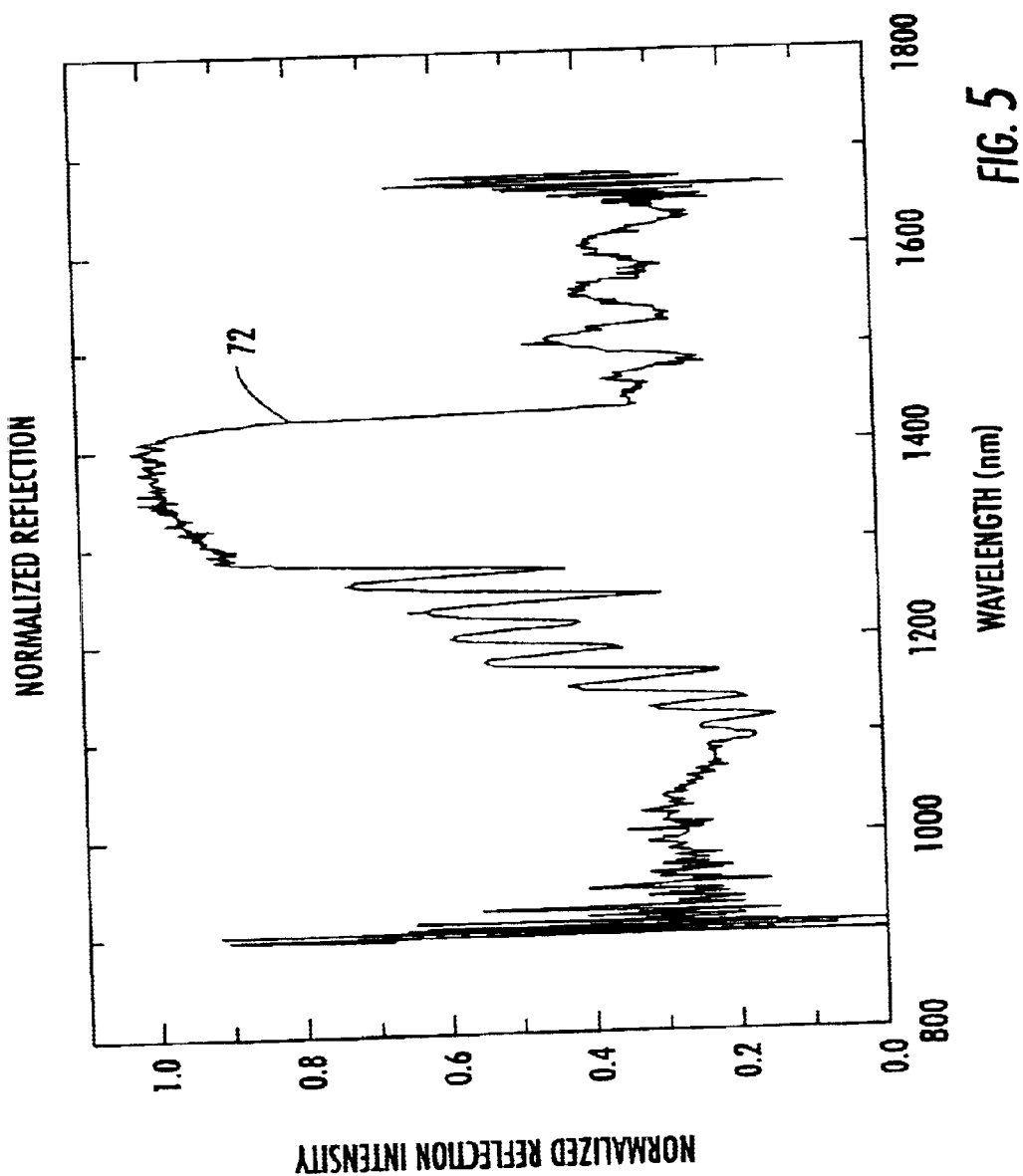
FIG. 5 is an exemplary normalized reflection intensity spectrum.

FIG. 5 includes plot 72 of normalized reflection intensity, which includes a magnitude which is increased significantly with respect to the raw reflection intensity data, shown in FIG. 4. In an exemplary embodiment, the normalized reflection intensity graph shown in FIG. 5 may preferably be obtained by choosing a wavelength of interest having a known reflectivity for a particular structure, then comparing the measured reflectivity value at the corresponding wavelength of the raw reflection intensity spectrum, and increasing or decreasing the reflection intensity, for all wavelengths in the plot, by a correction factor equal to the known reflectance at a given wavelength, divided by the measured raw reflectance at that wavelength. This normalization may be done by a computer in conjunction with the reflection intensity spectrum obtained by the spectrometer, but other normalization techniques may be used alternatively.

Figure 6:
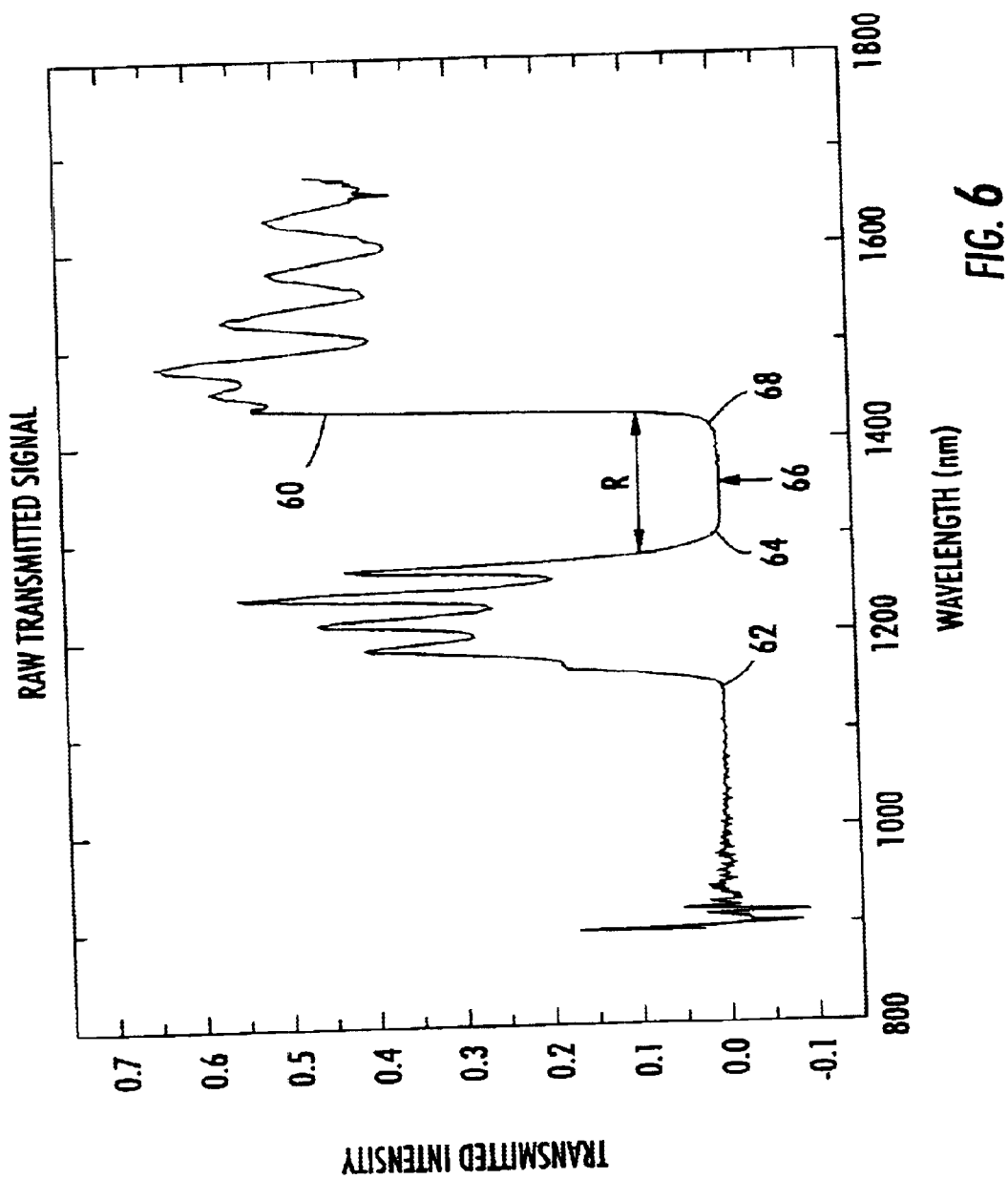
FIG. 6 is an exemplary raw transmission intensity spectrum.

FIG. 6 shows another exemplary plot 60 of a raw, uncorrected transmission intensity spectrum, substantially as shown and described in conjunction with FIG. 3. The exemplary transmission intensity spectrum shown in FIG. 6 may advantageously be normalized according to the present invention.

Figure 7:
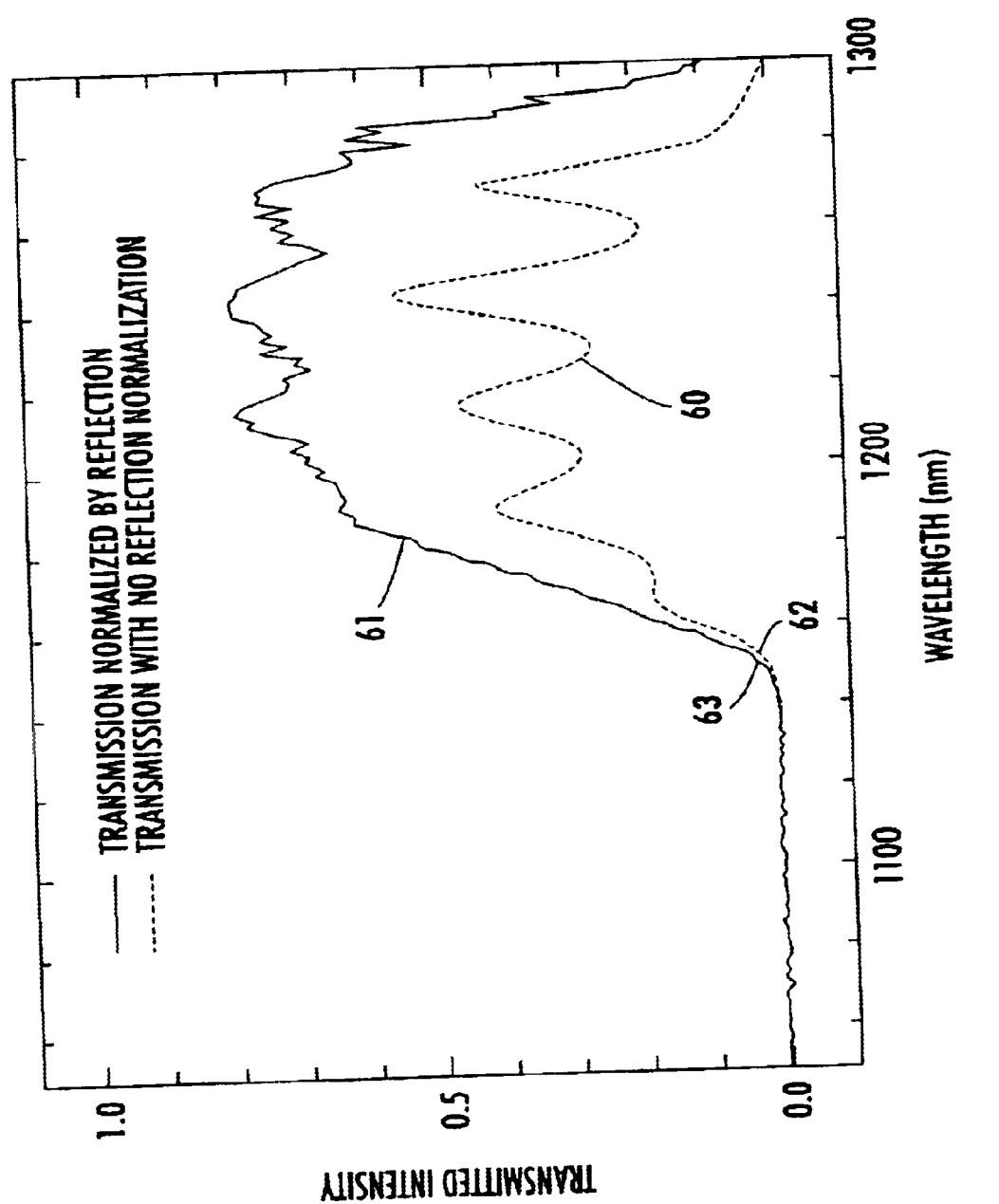
FIG. 7 shows an exemplary raw transmission intensity spectrum compared to a normalized transmission intensity spectrum.

FIG. 7 shows a portion of plot 60 of the raw transmitted intensity signals shown in FIG. 6, compared to the corresponding portion of the normalized transmission intensity signal, indicated by plot 61. Plot 60 may be normalized to produce normalized plot 61 according to the following. A spectrum of transmitted light ($T_{calc}$) may be calculated from the normalized or adjusted reflection spectrum ($R_{norm}$) shown in FIG. 5 for each wavelength, according to the following equation: $T_{calc}=1-R_{norm}$. In an exemplary embodiment, a computer may perform the normalization. The transmission intensity spectrum, calculated as such, is used to normalize the raw transmission intensity spectrum and to produce plot 61, such as shown in FIG. 7. In the region of the wavelength of interest, namely the band edge wavelength, the normalized transmission data ($T_{norm}$) is obtained by dividing the raw transmission intensity data by $T_{calc}$ for each wavelength. Plot 61 is the resulting data provided by a computer in the exemplary embodiment. The band edge wavelength, such as band edge wavelength 63 for normalized transmission plot 61, can then be accurately determined. The substrate temperature can be determined from the band edge wavelength using an algorithm such as shown in Appendix B. A computer may advantageously be used to apply this exemplary algorithm to the data, in an exemplary embodiment. Other algorithms and methods may be used to calculate substrate temperature from band edge wavelength.

As above, after substrate temperature is determined using the normalized transmission intensity spectrum and the mirror center is determined using the raw transmission intensity spectra, the computer or other means may be used to analyze the data and preferably provide real-time feedback to adjust the MBE system controls 52 (as shown in FIG. 2), to adjust the thickness of the films being formed.

Figure 8:
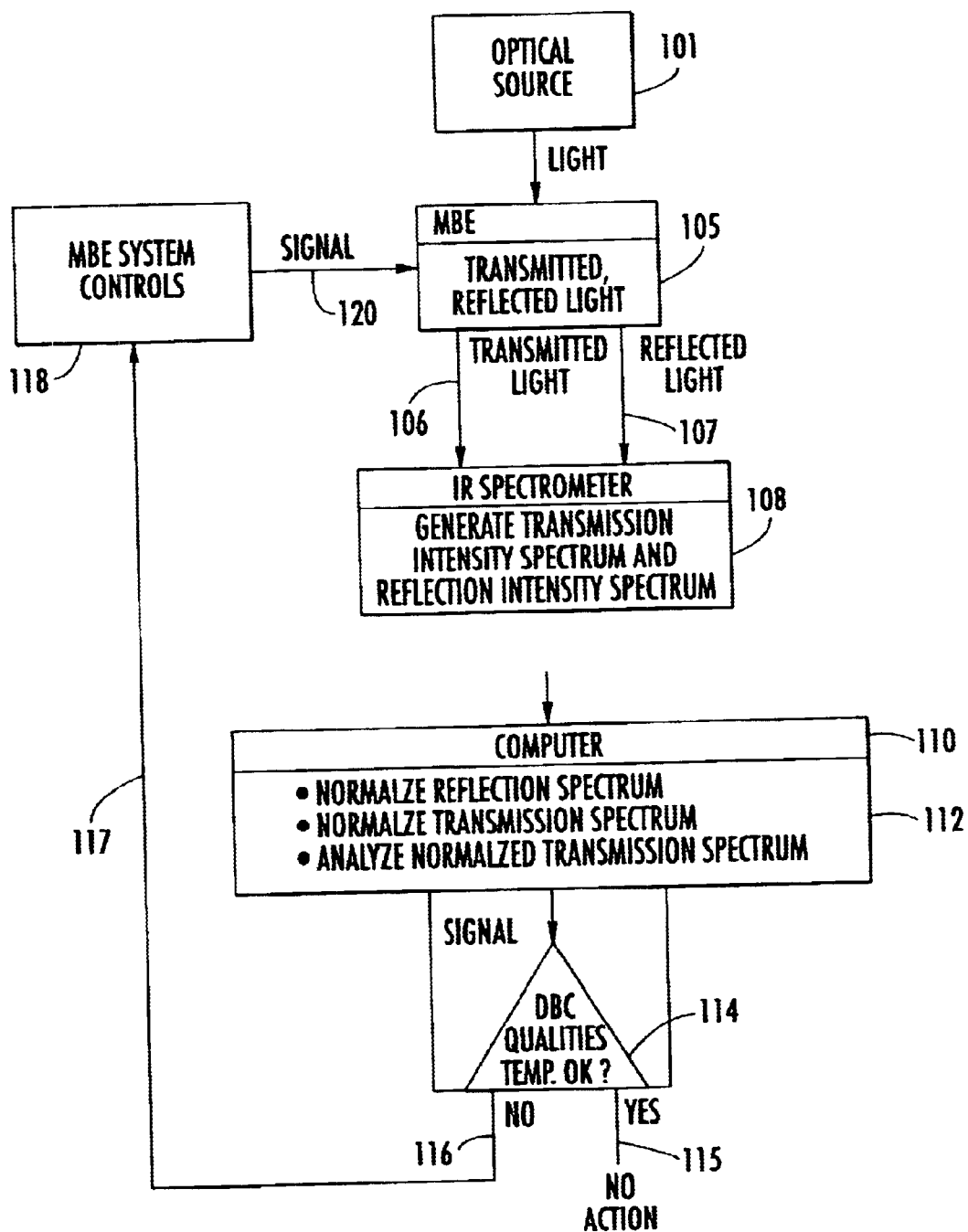
FIG. 8 is a flow chart of an exemplary method of the present invention.

A flowchart showing the sequence of the method of the present invention is shown in FIG. 8. FIG. 8 shows optical source 101 providing light to MBE chamber 105. In MBE chamber 105, light is both transmitted through and reflected from, the substrate. Transmitted light 106 and reflected light 107 are provided to infrared (IR) spectrometer 108, which generates a transmission intensity spectrum and a reflection intensity spectrum. The IR spectrometer communicates with computer 110, which analyzes the raw transmission intensity spectrum, normalizes the reflection intensity spectrum, and normalizes the transmission intensity spectrum based on the normalized reflection intensity spectrum. The computer then employs an algorithm to analyze the spectra and determine substrate temperature and mirror center. If the mirror center is correct at the measured substrate temperature, no action is taken at 115 and the MBE system controls are not adjusted. If the DBR center wavelength is not as desired 116 at the measured substrate temperature, then signal 117 is sent by the computer to MBE system controls 118 and a signal 120 is sent to MBE system 105 to adjust one or more of the film formation parameters.

This method of measuring transmitted light, measuring reflected light, and normalizing the transmitted light, includes the advantages that substrate temperature and DBR center wavelength are determined using a single apparatus.

Although discussed in reference to a DBR structure advantageously used in a long wavelength VCSEL, it should be understood that such is intended to be exemplary and not restrictive of the present invention. The apparatus and method of the present invention may equally be applied to any of various other film systems and structures.

The preceding merely describes principles of the invention. The present invention is not intended to be limited to the exemplary embodiments shown and described. Rather, the present invention is best described by the appended claims.

What is claimed is:

1. A method for determining a substrate temperature during film formation of a long-wavelength optoelectronic device, said method comprising the steps of:
    providing a substrate having a front side and a rear side, said substrate having a plurality of films formed on said front side;
    transmitting white light through said substrate and said films;
    detecting said transmitted light at wavelengths above 1000 nm;
    obtaining a transmission intensity spectrum of said transmitted light at wavelengths above 1000 nm;
    determining a band edge wavelength from transmission intensity spectrum; and
    determining the substrate temperature from said band edge wavelength.

2. The method of claim 1 wherein said step of transmitting white light through said substrate and said films comprises directing an optical beam onto said rear side of said substrate and said step of detecting said transmitted light comprises collecting said transmitted light exiting from said front side of said substrate and directing said transmitted light to a detector.

3. The method of claim 2 wherein said optoelectronic device comprises a vertical cavity surface emitting laser, and said plurality of films comprise a plurality of mirror films.

4. The method of claim 1 wherein said optoelectronic device comprises a vertical cavity surface emitting laser, and said plurality of films comprise a plurality of mirror films.

5. The method of claim 1 wherein said method is carried out in the operation of a film deposition apparatus and said method further comprises the steps of comparing said determined substrate temperature to a desired substrate temperature within a set of operating parameters of a control system for controlling film formation operations of said film deposition apparatus, and adjusting operation of said deposition apparatus to maintain said desired substrate temperature during subsequent film formation.

6. A method for determining a substrate temperature during film formation of a long-wavelength optoelectronic device, said method comprising the steps of:
    providing a substrate having a front side and a rear side, said substrate having a plurality of films formed on said front side;
    transmitting white light through said substrate and said films;
    detecting said transmitted light at wavelengths above 1000 nm;
    obtaining a transmission intensity spectrum of said transmitted light at wavelengths above 1000 nm;
    reflecting white light from said front side of said substrate;
    detecting said reflected light at wavelengths above 1000 nm;
    obtaining a measured reflection intensity spectrum of said reflected light at wavelengths above 1000 nm;
    normalizing said transmission intensity spectrum using said measured reflection intensity spectrum;
    determining a band edge wavelength from said normalized transmission intensity spectrum; and
    determining the substrate temperature from said band edge wavelength.

7. The method of claim 6 wherein said step of transmitting white light through said substrate and said films comprises directing an optical beam onto said rear side of said substrate and said step of detecting said transmitted light comprises collecting said transmitted light exiting from said front side of said substrate and directing said transmitted light to a detector.

8. The method of claim 7 wherein said optoelectronic device comprises a vertical cavity surface emitting laser, and said plurality of films comprise a plurality of mirror films.

9. The method of claim 8 wherein said step of normalizing includes adjusting said measured reflection intensity spectrum based on a known reflectivity at a predetermined wavelength, and then normalizing said transmission intensity spectrum using said adjusted reflection intensity spectrum.

10. The method of claim 7 wherein said step of normalizing includes adjusting said measured reflection intensity spectrum based on a known reflectivity at a predetermined wavelength, and then normalizing said transmission intensity spectrum using said adjusted reflection intensity spectrum.

11. The method of claim 6 wherein said optoelectronic device comprises a vertical cavity surface emitting laser, and said plurality of films comprise a plurality of mirror films.

12. The method of claim 11 wherein said step of normalizing includes adjusting said measured reflection intensity spectrum based on a known reflectivity at a predetermined wavelength, and then normalizing said transmission intensity spectrum using said adjusted reflection intensity spectrum.

13. The method of claim 6 wherein said step of normalizing includes adjusting said measured reflection intensity spectrum based on a known reflectivity at a predetermined wavelength, and then normalizing said transmission intensity spectrum using said adjusted reflection intensity spectrum.

14. The method of claim 6 wherein said method is carried out in the operation of a film deposition apparatus and said method further comprises the steps of comparing said determined substrate temperature to a desired substrate temperature within a set of operating parameters of a control system for controlling film formation operations of said film deposition apparatus, and adjusting operation of said deposition apparatus to maintain said desired substrate temperature during subsequent film formation.

15. A method for determining a mirror center wavelength during film formation of a long-wavelength optoelectronic device, said method comprising the steps of:

providing a substrate having a front side and a rear side, said substrate having a plurality of films formed on said front side;

transmitting white light through said substrate and said films;

detecting said transmitted light at wavelengths above 1000 nm;

obtaining a transmission intensity spectrum of said transmitted light at wavelengths above 1000 nm; and determining said mirror center wavelength from said transmission intensity spectrum.

16. The method of claim 15 wherein said step of transmitting white light through said substrate comprises directing an optical beam onto said rear side of said substrate and said step of detecting said transmitted light comprises collecting said transmitted light exiting from said front side of said substrate and directing said transmitted light to a detector.

17. The method of claim 15 wherein said optoelectronic device comprises a vertical cavity surface emitting laser.

18. The method of claim 16 wherein said optoelectronic device comprises a vertical cavity surface emitting laser.

19. The method of claim 15 wherein said method is carried out in the operation of a film deposition apparatus and said method further comprises the steps of comparing said determined mirror center wavelength to a desired mirror center wavelength within a set of operating parameters of a control system for controlling film formation operations of said film deposition apparatus, and adjusting operation of said deposition apparatus to maintain said desired mirror center wavelength during subsequent film formation.

20. A method for determining a mirror center wavelength during film formation of a long-wavelength optoelectronic device, said method comprising the steps of:

providing a substrate having a front side and a rear side, said substrate having a plurality of films formed on said front side;

transmitting white light through said substrate and said films;

detecting said transmitted light at wavelengths above 1000 nm;

obtaining a transmission intensity spectrum of said transmitted light at wavelengths above 1000 nm;

reflecting white light from said front side of said substrate;

detecting said reflected light at wavelengths above 1000 nm;

obtaining a measured reflection intensity spectrum of said reflected light at wavelengths above 1000 nm;

normalizing said transmission intensity spectrum using said measured reflection intensity spectrum; and determining said mirror center wavelength from said normalized transmission intensity spectrum.

21. The method of claim 20 wherein said step of transmitting white light through said substrate comprises directing an optical beam onto said rear side of said substrate and said step of detecting said transmitted light comprises collecting said transmitted light from said front side of said substrate and directing said transmitted light to a detector.

22. The method of claim 21 wherein said optoelectronic device comprises a vertical cavity surface emitting laser.

23. The method of claim 22 wherein said step of normalizing includes adjusting said measured reflection intensity spectrum based on a known reflectivity at a predetermined wavelength, and then normalizing said transmission intensity spectrum using said adjusted reflection intensity spectrum.

24. The method of claim 21 wherein said step of normalizing includes adjusting said measured reflection intensity spectrum based on a known reflectivity at a predetermined wavelength, and then normalizing said transmission intensity spectrum using said adjusted reflection intensity spectrum.

25. The method of claim 20 wherein said optoelectronic device comprises a vertical cavity surface emitting laser.

26. The method of claim 25 wherein said step of normalizing includes adjusting said measured reflection intensity spectrum based on a known reflectivity at a predetermined wavelength, and then normalizing said transmission intensity spectrum using said adjusted reflection intensity spectrum.

27. The method of claim 20 wherein said step of normalizing includes adjusting said measured reflection intensity spectrum based on a known reflectivity at a predetermined wavelength, and then normalizing said transmission intensity spectrum using said adjusted reflection intensity spectrum.

28. The method of claim 20 wherein said method is carried out in the operation of a film deposition apparatus and said method further comprises the steps of comparing said determined mirror center wavelength to a desired mirror center wavelength within a set of operating parameters of a control system for controlling film formation operations of said film deposition apparatus, and adjusting operation of said deposition apparatus to maintain said desired mirror center wavelength during subsequent film formation.

29. A method of correcting for a distortion of light transmitted through a plurality of films formed on a substrate comprising the steps of:

transmitting white light through said substrate and said films;

detecting said transmitted light;

obtaining a transmission intensity spectrum of said transmitted light;

reflecting white light from said front side of said substrate;

detecting said reflected light;

obtaining a measured reflection intensity spectrum of said reflected light; and normalizing said transmission intensity spectrum using said measured reflection intensity spectrum.

30. The method of claim 29 wherein said step of transmitting white light through said substrate comprises directing an optical beam onto said rear side of said substrate and said step of detecting said transmitted light comprises collecting said transmitted light from said front side of said substrate and directing said transmitted light to a detector.

31. The method of claim 29 wherein said step of normalizing includes adjusting said measured reflection intensity spectrum based on a known reflectivity at a predetermined wavelength, and then normalizing said transmission intensity spectrum using said adjusted reflection intensity spectrum.

* * * * *